United States Patent [19]

Nakamoto et al.

[11] Patent Number: 5,470,767
[45] Date of Patent: Nov. 28, 1995

[54] METHOD OF MAKING FIELD EFFECT TRANSISTOR

[75] Inventors: Takahiro Nakamoto; Tetsuya Yagi, both of Itami, Japan

[73] Assignee: Mitsubishi Denki Kabushiki Kaisha, Tokyo, Japan

[21] Appl. No.: 321,851

[22] Filed: Oct. 14, 1994

Related U.S. Application Data

[62] Division of Ser. No. 101,690, Aug. 4, 1993, abandoned.

[30] Foreign Application Priority Data

Aug. 6, 1992 [JP] Japan ................... 4-209940

[51] Int. Cl.⁶ ................. H01L 21/265; H01L 21/44; H01L 21/48
[52] U.S. Cl. ............... 437/39; 437/176; 437/197; 437/203; 437/912
[58] Field of Search ............... 257/280, 281, 257/282, 283, 284; 437/39, 175, 176, 203, 912, 197

[56] References Cited

U.S. PATENT DOCUMENTS

| | | | |
|---|---|---|---|
| 4,700,462 | 10/1987 | Beaubien et al. | 437/187 |
| 4,959,326 | 9/1990 | Roman et al. | 437/39 |
| 5,032,541 | 7/1991 | Sakamoto et al. | 437/39 |
| 5,196,358 | 3/1993 | Boos | 437/39 |
| 5,288,654 | 2/1994 | Kasai et al. | 437/912 |
| 5,378,914 | 1/1995 | Ohzu et al. | 257/369 |

FOREIGN PATENT DOCUMENTS

| | | | |
|---|---|---|---|
| 59-004173 | 1/1984 | Japan . | |
| 61-59881 | 3/1986 | Japan | 257/283 |
| 62-114276 | 5/1987 | Japan . | |
| 62-156876 | 7/1987 | Japan | 257/283 |
| 63-15475 | 1/1988 | Japan | 257/283 |
| 1117071 | 5/1989 | Japan . | |
| 246740 | 2/1990 | Japan . | |
| 2105424 | 4/1990 | Japan | 257/283 |
| 2105423 | 4/1990 | Japan | 257/283 |
| 2232940 | 9/1990 | Japan . | |
| 4186848 | 7/1992 | Japan . | |

OTHER PUBLICATIONS

Nummila et al., "Fabrication Of Sub–100–nm T Gates With SiN Passivation Layer", Journal of Vacuum Science Technology, vol. B9, No. 6, 1991, pp. 2870–2874.

Pospieszakski et al., "Noise Parameters And Light Sensitivity Of Low–Noise High–Electron–Mobility Transistors At 300 And 12.5 K", IEEE Transactions on Electron Devices, vol. ED–33, No. 2, Feb. 1986, pp. 218–223.

*Primary Examiner*—Olik Chaudhuri
*Assistant Examiner*—Brian K. Dutton
*Attorney, Agent, or Firm*—Leydig, Voit & Mayer

[57] ABSTRACT

A semiconductor device having a gate electrode having a leg with two mutually offset portions is formed by successively depositing on a semiconductor substrate an amorphous material and a crystalline metal layer. A portion of the crystalline metal layer is removed photolithographically and the amorphous material is etched to form a hole extending to the semiconductor substrate. The through hole is filled when a second amorphous material is deposited on the crystalline metal layer. A second hole is photolithographically prepared in the second amorphous material, partially aligned with the first hole and filled with a gate electrode material, and thereafter the second amorphous material, crystalline metal layer, and original amorphous material are removed, leaving a gate electrode having a leg with mutually offset portions.

3 Claims, 10 Drawing Sheets

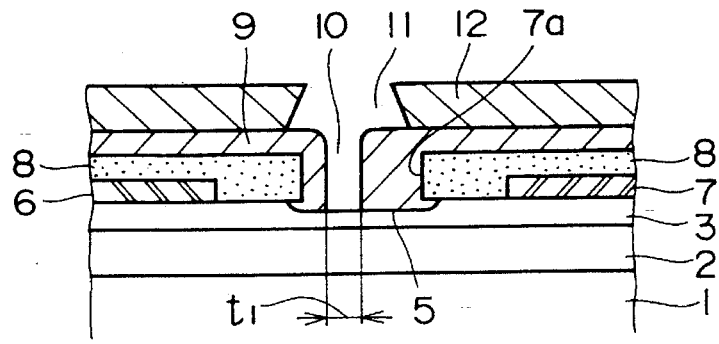
Fig. 1 (a) Prior Art
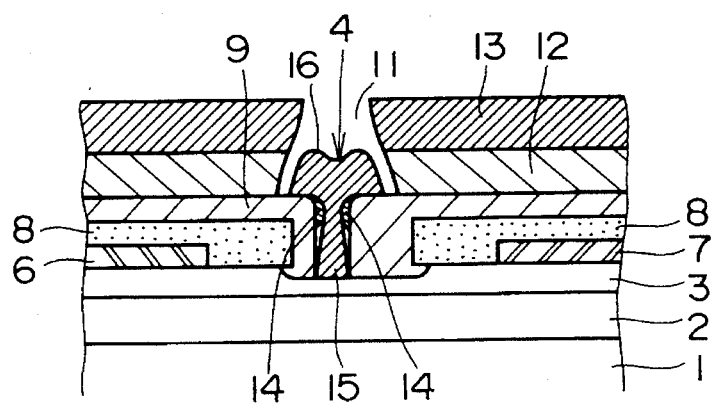
Fig. 1 (b) Prior Art
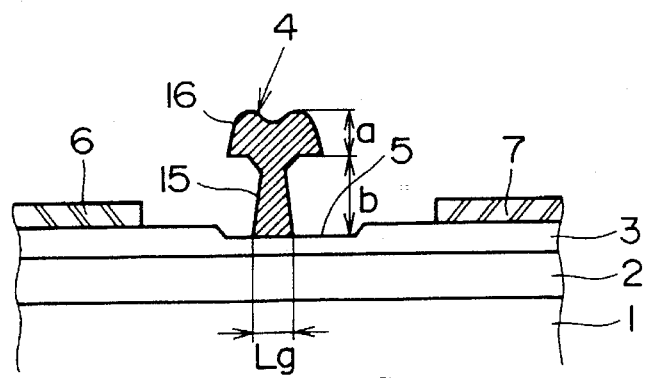
Fig. 1 (c) Prior Art

METHOD OF MAKING FIELD EFFECT TRANSISTOR

This disclosure is a division of application Ser. No. 08/101,690, filed Aug. 4, 1993, now abandoned.

This invention relates to a semiconductor device, such as a field effect transistor (FET) and a high electron mobility transistor (ttEMT), and a method of making such a semiconductor device.

BACKGROUND OF THE INVENTION

FIG. 1(c) is a cross-sectional view of an example of a conventional semiconductor device shown in Japanese Unexamined Patent Publication No. SHO 63-15475 (JP-A-63 15 475). On a semiconductor substrate I, a buffer layer 2 and a semiconductor active layer 3 are stacked, and a gate electrode 4 having a length Lg is disposed in a recess 5 formed in the surface of semiconductor active layer 3.

The semiconductor device having a cross-sectional structure shown in FIG. 1(c) may be made in the following manner. As shown in FIG. 1(a), buffer layer 2 and semiconductor active layer 3 are stacked. Recess 5 is then formed in the surface of active layer 3. A source electrode 6 and a drain electrode 7 are then disposed on active layer 3. Then, a resist layer 8 having an opening 7a therein at a location corresponding to recess 5 is formed. After that another resist layer 9 having an opening 10 extending to recess 5 is formed. The width $t_1$ of the opening 10 determines the length Lg of completed gate electrode 4 shown in FIG. 1(c). After that a resist layer 12 having an opening 11 is formed.

A gate metal, such as aluminum (Al), forming gate electrode 4 is vapor deposited from above the structure shown in FIG. 1(a), so that the gate metal is deposited within openings 10 and 11 as shown in FIG. 1(b), whereby T-shaped gate electrode 4 is formed. A gate metal layer 13 is disposed on the resist layer 12.

Gate metal layer 13 and resist layers 12, 9 and 8 are removed off, and the semiconductor device having gate electrode 4 is completed. The details of manufacturing steps of this device are described in Japanese Unexamined Patent Publication No. SHO 63-15475 (JP-A-63 15 475).

According to the above-described conventional manufacturing method, however, when the gate metal is vapor deposited, the metal is also deposited on upper portions of opening 10 in resist layer 9 as indicated by a reference numeral 14 in FIG. 1(b), to thereby making the upper end of opening 10 narrower and narrower as the vapor deposition advances. This causes the amount of the metal passing through opening 10 to decrease gradually so that a leg portion 15 of gate electrode 14 disposed in recess 5 becomes tapered as shown in FIG. 1(b) and 1(c). Sometimes leg 15 may be broken when it is tall and, therefore, there is a limitation on the height of the gate electrodes. Then, the spacing between the head 16 of gate electrode 4 and semiconductor active layer 3 cannot be made larger. This means that the capacitance between head 16 of gate electrode 4 and semiconductor active layer 3 cannot be made smaller than a certain value, which is one of the limits on improvement of the operating speed of ICs.

One may contemplate increasing the gate length Lg so as to permit formation of a thicker upper end of leg 15 of gate electrode 4. One of factors determining characteristics, such as a noise factor (NF), of a FET is the gate length Lg. It is known that as the gate length Lg increases, the noise factor NF decreases. Therefore the gate length Lg cannot be increased much.

According to the above-referenced conventional technique, gate electrode 4 is formed by vapor depositing a gate metal, and, therefore, the height, a, of head 16 and the height, b, of leg 15 should be equal. Accordingly, in case that there is a restriction on the height of gate electrode 4, it is not possible to form a longer leg with a shorter head. Thus, the height of leg 15 cannot exceed a prescribed value, and, therefore, electrostatic capacitance between head 16 of gate electrode 14 and semiconductor active layer 3 cannot be made smaller than a prescribed value.

Japanese Unexamined Patent Publication No. SHO 61-59881 (JP-A-61 59 881) shows another example of a method of making a semiconductor device having a T-shaped gate electrode. According to this method, as shown in its FIG. 6, a gate electrode can be disposed at a location closer to a source. However, the gate electrode is formed by vapor-depositing a gate metal as in JP-A-63 15475, and, therefore, this prior art also has the same problem.

Another examples of prior art techniques for making a semiconductor device having a T-shaped gate electrode are shown in Japanese Unexamined Patent Publication No. HEI 2-105423 (JP-A-21 05 423) and No. HEI 2-105424 (JP-A-21 05 424). According to these techniques, a gate electrode having an expanded head is located on the drain electrode side so as to minimize source-gate capacitance. However, in these techniques, too, the gate electrode is formed by vapor depositing a gate electrode metal as in the previously described prior art techniques. These techniques also have the same problem.

An object of the present invention is to provide a semiconductor device having a T-shaped gate electrode having a ratio of the height of a leg of the gate electrode to the total height of the gate electrode greater than ½, and a method of making such a semiconductor device.

Another object of the present invention is to provide a semiconductor device having a T-shaped gate electrode having a leg of which the cross-sectional area in planes parallel to the surface of a semiconductor substrate, i.e. the transverse cross-sectional area, is substantially constant along the entire height, and a method of making such a semiconductor device.

SUMMARY OF THE INVENTION

According to a first aspect of the present invention, a semiconductor device is provided, which includes a gate electrode having a leg extending substantially perpendicular to a planar surface of a semiconductor substrate, and having a head at the upper end of the leg. The base of the leg of the gate electrode is in contact with a semiconductor active layer on the substrate. The ratio of the height of the leg to the total height of the gate electrode is greater than ½. Thus, a larger distance can be placed between a head of the gate electrode and the semiconductor layer to provide a smaller capacitance therebetween in comparison with conventional devices.

According to another feature of the invention, a semiconductor device is provided, which includes a gate electrode having a leg extending substantially perpendicular to a planar surface of a semiconductor substrate, and having a head at the upper end of the leg. The base of the leg of the gate electrode is in contact with a semiconductor active layer on the substrate. The transverse cross-sectional area in planes parallel to the surface of the substrate is substantially constant over the entire height of the leg. Thus, a strong connection is available between the leg and the head on it relative to conventional devices so that the height of the leg can be made larger than conventionally available to thereby reduce the capacitance between the head and the semiconductor active layer. Furthermore, because the leg is not tapered, the gate length Lg can be reduced, which can improve the noise factor (NF) of the device.

According to still another feature of the present invention, the ratio of the height of the leg to the total height of the gate electrode is greater than ½, and the transverse cross-sectional area is substantially constant over the entire height of the leg.

A method of manufacturing a semiconductor device having a T-shaped gate electrode according to a feature of the present invention includes the steps of dispositing an amorphous film of a material over a semiconductor active layer on a semiconductor substrate, depositing on the amorphous material film, a resist layer having an opening having a predetermined dimensions therein for defining the size and location of a leg of a gate electrode to be formed, using the resist layer as a mask to etch a portion of the amorphous film to form a through-hole therein which communicates with the opening in the amorphous film, removing the resist layer, selectively depositing a gate electrode metal on the semiconductor active layer revealed through the through-hole in the amorphous material film to thereby form a gate electrode having a leg of which the height is more than one half the total height of the gate electrode, and removing the amorphous material film. The deposition of the gate electrode metal may be done by, for example, chemical vapor deposition (CVD). According to this method, a T-shaped gate electrode having a leg longer than one half of the total height can be provided, and the transverse cross-sectional area of the leg is substantially constant along the height of the leg.

A method of manufacturing a semiconductor device having a gate electrode according to a still further aspect of the present invention includes a step of depositing a first amorphous material layer on a semiconductor active layer disposed on a semiconductor substrate, a step of depositing a crystalline metallic layer on the first amorphous material layer, a step of forming, on the crystalline metallic layer, a first resist layer having a first opening therein for defining the size and location of a leg of a gate electrode to be formed, a step of using the first resist layer as a mask to remove a portion of the crystalline metallic layer and then etching the amorphous material layer to form a though-hole which extends through the crystalline metallic layer and first amorphous material layer, a step of removing the first resist layer, a step of despositing a second amorphous material layer covering the crystalline metallic layer and filling the through-hole, a step of depositing, on the second amorphous material layer, a second resist layer including a second opening having an edge closer to a source electrode to be formed on the semiconductor active layer and substantially in alignment with the source electrode side edge of the first opening and having a drain electrode side edge nearer the drain electrode side edge of the first opening to a drain electrode to be formed on the semiconductor active layer, a step of using the second resist layer as a mask to etch the second amorphous layer to form therein a second through-hole in the second amorphous material layer, said second through-hole communicating with the second opening in the second resist layer, a step of removing the second resist layer, a step of selectively depositing a gate electrode metal on the semiconductor active layer and crystalline metallic layer revealed through the second through-hole to thereby form a gate electrode, a step of removing the second amorphous material layer and then removing the crystalline metallic layer, and a step of removing the first amorphous material layer. The gate electrode metal may be deposited by, for example, CVD. According to this method, the gate electrode has a substantially constant transverse cross-sectional area. Furthermore, according to this method, a head can be formed on the drain electrode side of the top end of the leg of the gate electrode.

BRIEF DESCRIPTION OF THE DRAWINGS

FIGS. 1(a), 1(b) and 1(c) are cross-sectional views showing steps of manufacturing a conventional semiconductor device having a T-shaped gate electrode, and a cross-sectional view of the thus completed conventional semiconductor device;

DETAILED DESCRIPTION OF PREFERRED EMBODIMENTS

Figure 2:
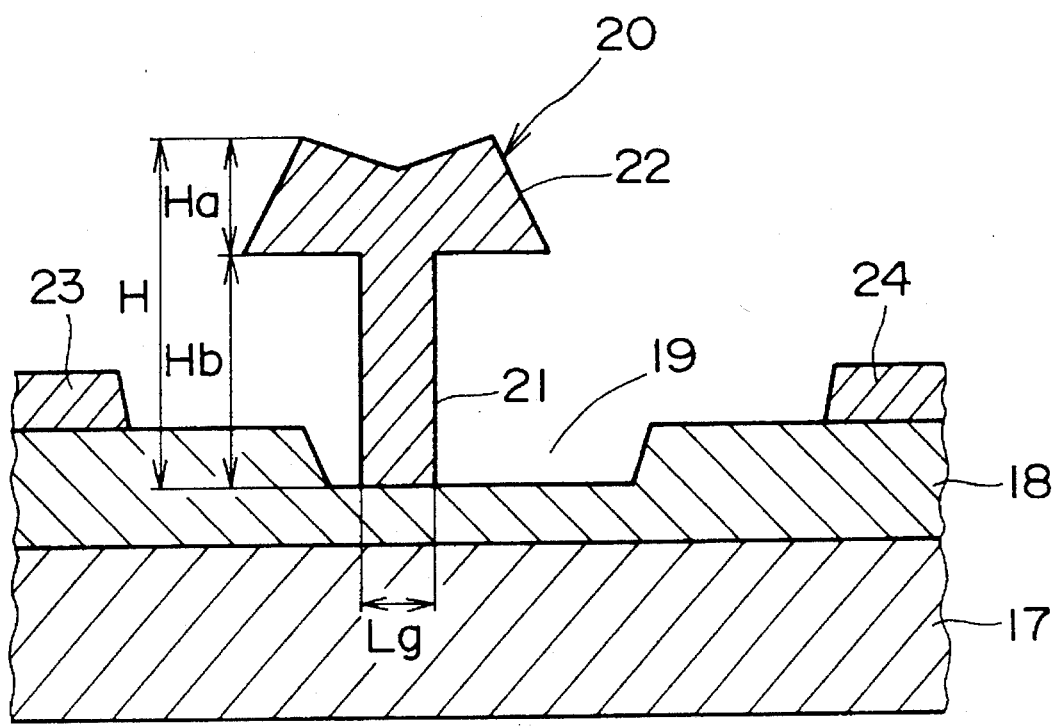
FIG. 2 is a cross-sectional view of a semiconductor device according to a first embodiment of the present invention.

FIG. 2 shows a semiconductor device according to a first embodiment of the present invention. In FIG. 2, a semiconductor substrate 17 comprises a semiconductor material, such as GaAs and InP, and has a thickness of, for example, about 500 μm. A semiconductor active layer 18 of a material, such as N-type GaAs, N-type AlGaAs/GaAs and N-type InGaAs/GaAs, is disposed on substrate 17. The thickness of layer 18 is about 0.5 μm or a value between about 0.3 μm and about 0.7 μm. A recess 19 is formed in semiconductor active layer 18 at a location where a gate electrode of the device is to be formed. The depth and width of recess 19 are about 0.2–0.4 μm and about 0.9–1.3 μm, respectively. A so-called T-shaped gate electrode 20 is disposed in this recess 19. The length of gate electrode 20 which contacts recess 19, i.e. the effective gate length Lg of a leg 21 of gate electrode 20, is 0.3 μm or a value between 0.1 μm and 0.6 μm. A head 22 is at the top of leg 21. Head 22 has an arm extending on the side of a source electrode 23 and an arm extending on the side of a drain electrode 24. Gate electrode 20 has a height H measured from the bottom surface of recess 19 which is 1.0 μm or a value between 0.6 μm and 2.0 μm. The height $H_a$ of head 22 is about 0.3 μm or a value between 0.2 μm and 0.6 μm. The height $H_b$ of leg 21 is about 0.7 μm or a value between 0.4 μm and 1.4 μm. Thus, the ratio of the height $H_b$ of leg 21 to the height H of gate electrode 20 is 0.7 μm/1.0 μm=7/10, which is larger than ½ of the ratio in conventional gate electrode 4 shown in FIG. 1. Even if the height H of gate electrode 20 should be restricted for some reason, the height $H_b$ of leg 21 can be relatively longer so that the electrostatic capacitance formed between head 22 and semiconductor active layer 18 can be reduced.

As a result, the operation speed of an integrated circuit incorporating this semiconductor device is improved.

The transverse cross-sectional areas of leg 21 in any of the planes parallel to the surface of semiconductor substrate 17 are constant throughout the height of leg 21. That is, leg 21 is not tapered in contrast to that of gate electrode 4 shown in FIG. 1. Thus, the vertical height of leg 21 can be larger than in conventional devices, so that the electrostatic capacitance between head 22 of gate electrode 20 and semiconductor active layer 18 on substrate 17 can be reduced relative to conventional devices. Furthermore, because leg 21 is not tapered, the gate length Lg at the base of leg 21 can be smaller relative to conventional devices, which can improve the noise factor (NF) of the device.

Aluminum, for example, may be used as the material for gate electrode 20. Gate electrode 20 may be located at a position closer to source electrode 23 than the drain electrode 24 within recess 19.

Figure 3:
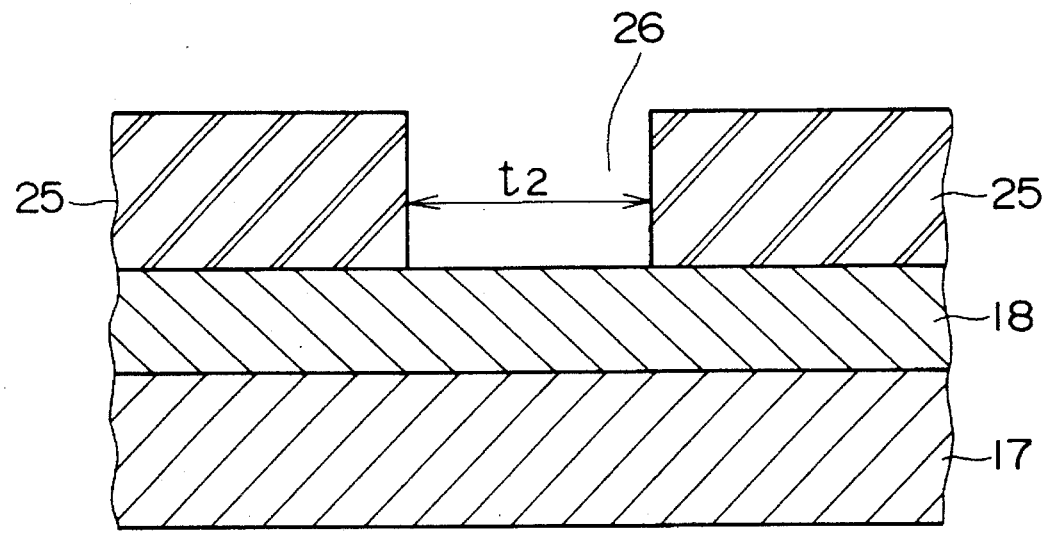
FIG. 3(a) through FIG. 3(f) are cross-sectional views showing various steps of manufacturing the semiconductor device according to the first embodiment shown in FIG. 2.
Figure 3:
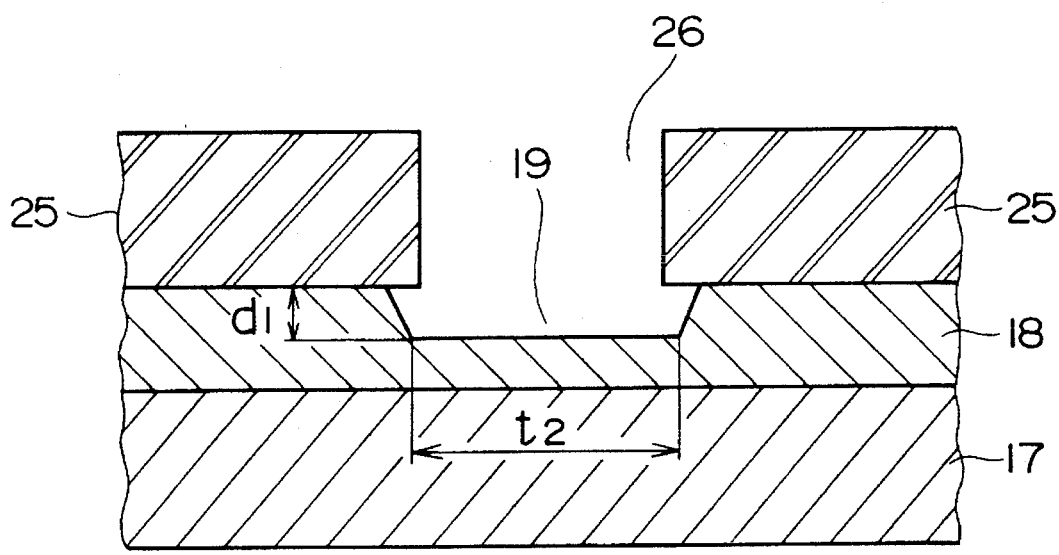
Figure 3:
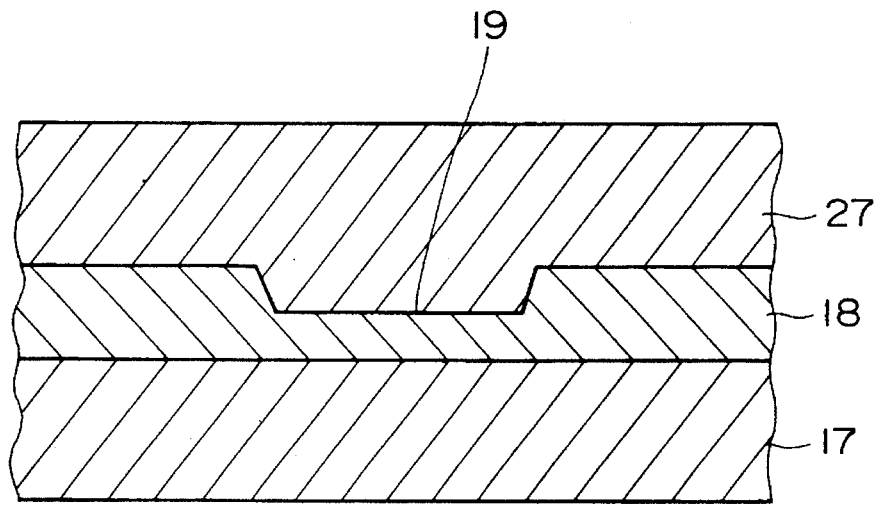
Figure 3:
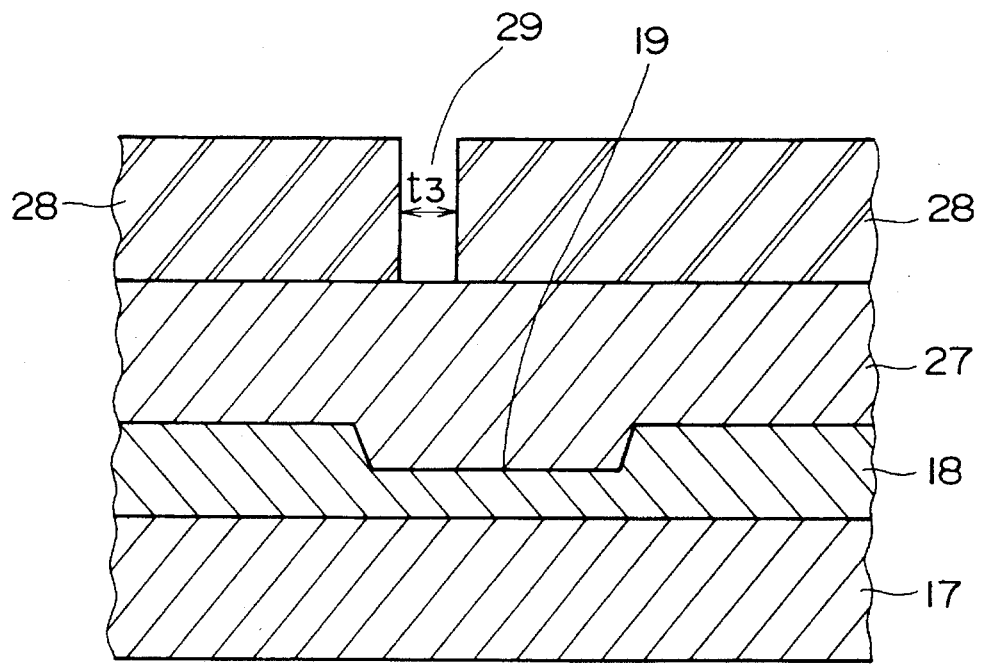
Figure 3:
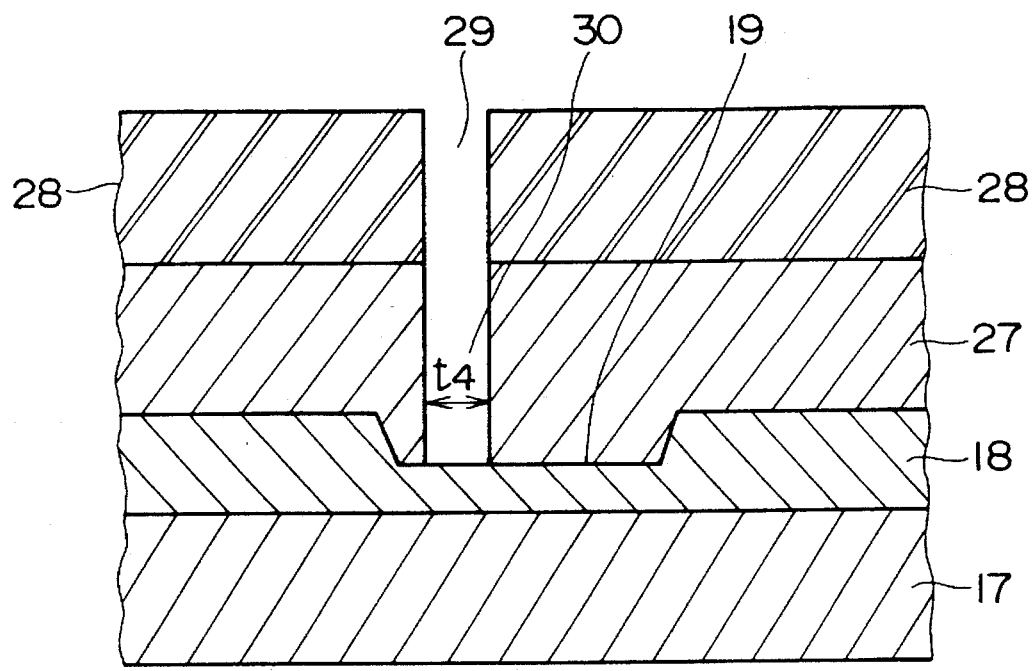
Figure 3:
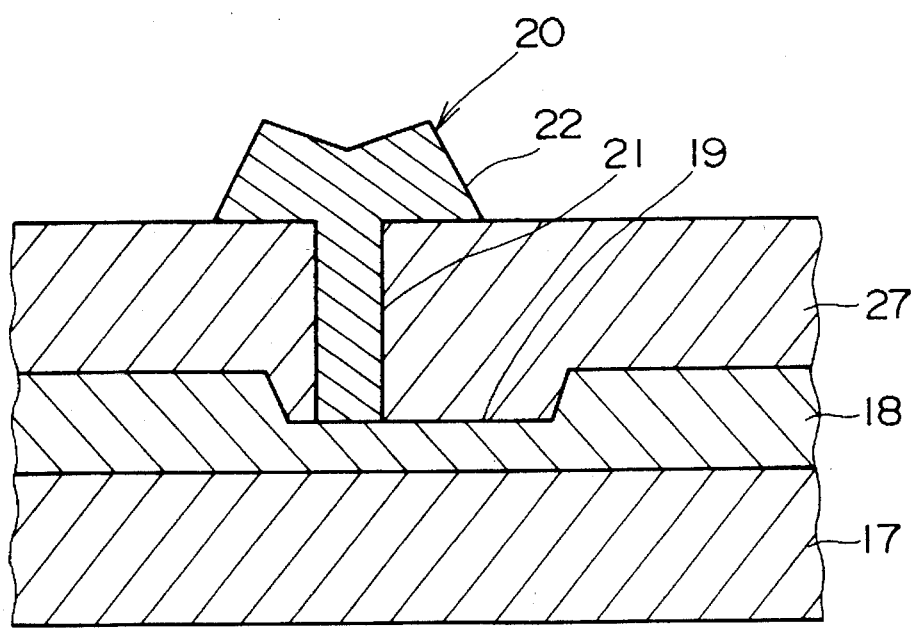

A method of making the semiconductor device shown in FIG. 2 is now explained with reference to FIG. 3.

First, on a GaAs or InP semiconductor substrate 17 having a thickness of about 500 μm, an N-type GaAs, N-type AlGaAs/GaAs, or N-type InGaAs/GaAs semiconductor active layer 18 having a thickness of about 0.5 μm is grown, and, then a first resist layer 25 having a thickness of about 0.5 μm is disposed on active layer 18. Resist layer 25 is patterned by means of photolithography, such as electron beam direct-write lithography or optical exposure, to thereby form a first opening 26 at a location corresponding to a location of a recess 19 to be formed in semiconductor active layer 18. (See FIG. 3(a).) First resist layer 25 may be a photoresist. The first opening has a width $t_2$ of, for example, about 1.0 μm, or a value between 0.8 μm and 1.2 μm.

Next, as shown in FIG. 3(b), first resist layer 25 is used as a mask to remove a portion of semiconductor active layer 18 to a desired depth so that recess 19 is formed therein. Wet etching with, for example, a phosphoric acid type etchant or a sulfuric acid type etchant may be employed to form recess 19. Recess 19 has a width $t_2$ of about 1.0 μm, or a value between 0.9 μm and 1.3 μm, and a depth $d_1$ of about 0.3 μm.

Then, as shown in FIG. 3(c), an organic solvent, such as acetone, is used to dissolve away first resist layer 25, and an amorphous material layer 27 of, for example, silicon nitride, SiON or SiO, is deposited on semiconductor active layer 18 by means of, for example, ECR plasma CVD. Amorphous material layer 27 has a flat surface and has a thickness of about 0.4 μm, or a value between 0.2 μm and 1.0 μm. A second resist layer 28 having a thickness of about 0.5 μm, or a value between 0.3 μm and 1.0 μm, is deposited on amorphous material layer 27.

By means of suitable photolithography, such as electron beam direct-write lithography, second resist layer 28 is patterned to form a second opening 29 in second resist layer 28 at a location where leg 21 of gate electrode 20 (FIG. 2) is to be formed. As shown in FIG. 3(d), opening 29 is located closer to the left-hand (source electrode side) edge of recess 19 than to the right-hand edge of recess 19. SPR510, THHRiP2000 or the like may be used as the material of second resist layer 28. The width $t_3$ of second opening 29 is about 0.3 μm, or a value between 0.1 μm and 0.6 μm.

Second resist layer 28 is used as a mask to etch amorphous material layer 27 by, for example, anisotropic dry etching. The etching produces a through-hole 30 communicating with second opening 29 and extending to recess 19 in amorphous material layer 27, as shown in FIG. 3(e). The width $t_4$ of the through-hole 30 is about 0.3 μm. For example, reactive ion etching (RIE), reactive ion beam etching (RIBE), electron cyclotron resonance (ECR) etching or other suitable dry etching may be used as the anisotropic dry etching.

Next, second resist layer 28 is removed by dissolving it with an organic solvent, such as acetone. Thereafter, as shown in FIG. 3(f), a metal, such as aluminum, for forming gate electrode 20 is selectively deposited on recess 19 in semiconductor active layer 18 by means of MOCVD which takes advantage of thermal decomposition of dimethylaluminum hydride. Thus, T-shaped gate electrode 20 having leg 21 joined at its base to active layer 18 in recess 19 and having expanded head 22 as shown in FIG. 3(f) is produced.

Gate electrode 20 is formed by selectively growing aluminum or another suitable gate electrode metal in recess 19 an active layer 18 which makes it possible to form leg 21 having substantially the same dimensions at the top portion thereof as the dimensions, including the gate length Lg, at the base thereof. The transverse cross-sectional area of leg 21 is substantially constant over the entire height thereof. By selecting a suitable thickness for amorphous material layer 27, a desired height $H_b$ of leg 21 is provided. A desired height $H_a$ of head 22 is provided by properly choosing the duration of selective deposition of aluminum. In this embodiment, the ratio of the height of leg 21 to the total height of gate electrode 20 is 7:10, while that of the prior art is 1:2.

Thereafter, amorphous material layer 27 is removed by isotropic dry etching, such as, for example, plasma etching. Then, as shown in FIG. 2, source electrode 23 and drain electrode 24 are disposed on semiconductor active layer 18. Thus the semiconductor device is completed.

Figure 4:
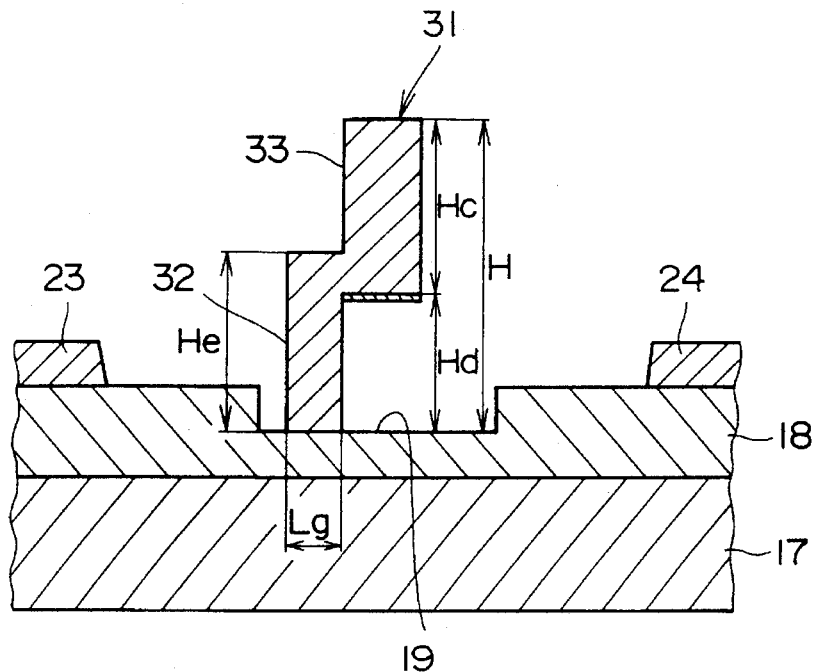
FIG. 4 is a cross-sectional view of a semiconductor device according to a second embodiment of the present invention.

FIG. 4 shows a semiconductor device according to a second embodiment of the present invention. In FIG. 4, the same reference numerals as used in FIG. 2 denote the same or similar items or functions, and, therefore, description of them is omitted. A gate electrode 31 is disposed in recess 19. Gate electrode 31 includes a leg 32 standing perpendicular to the plane of the surface of the semiconductor substrate 17. A head 33 of gate electrode 31 extends in the same direction as leg 32 with its base joined to the drain electrode side surface of the top portion of leg 32, as shown in FIG. 4. With this structure, electrostatic capacitance between source electrode 23 and gate electrode 31 is minimized. The effective gate length Lg of gate electrode 31 is equivalent to that of gate electrode 20 of the first embodiment shown in FIG. 2. The height H of gate electrode 31 from the bottom surface of recess 19 is about 1.4 μm or a value between 1.0 μm and 2.2 μm. The vertical height $H_c$ of head 33 is about 0.8 μm or a value between 0.6 μm and 1.2 μm, and the height $H_e$ of leg 32 is about 0.8 μm or a value between 0.6 μm and 1.2 μm. The material of gate electrode 31 may be the same as that of gate electrode 20 shown in FIG. 2, and is aluminum, for example. Gate electrode 31 is disposed at a location in recess 19 closer to source electrode 23 than to drain electrode 24, as shown in FIG. 2.

Figure 5:
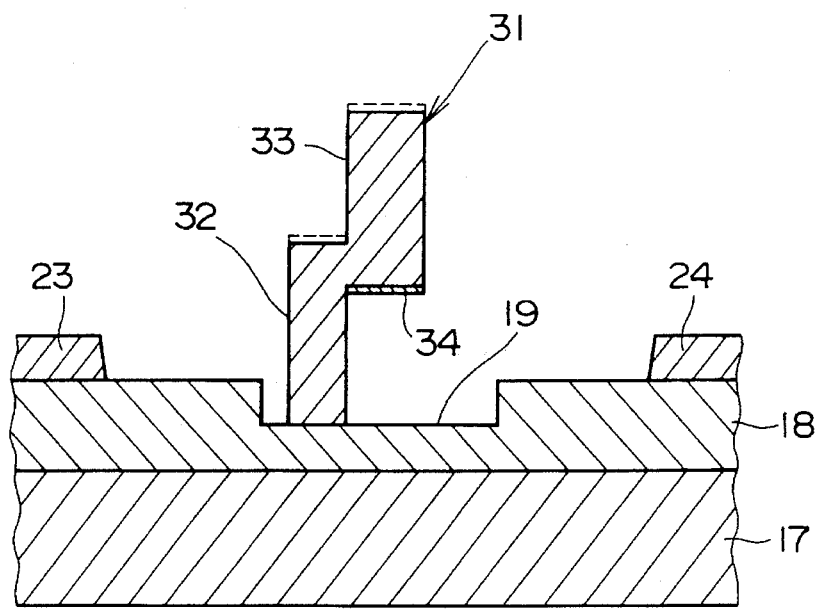
FIG. 5(a) through FIG. 5(i) are cross-sectional views showing various steps of manufacturing the semiconductor device shown in FIG. 4.
Figure 5:
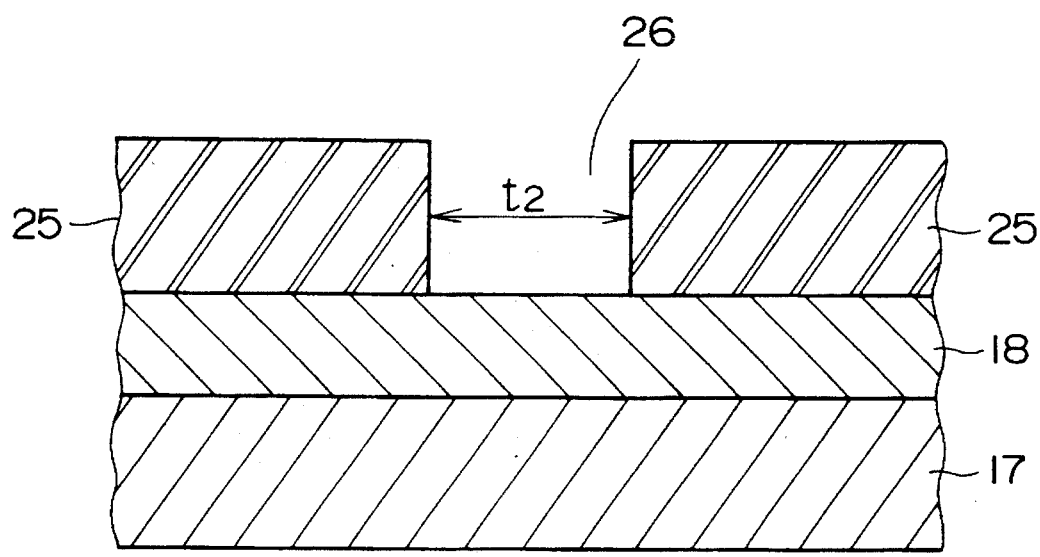
Figure 5:
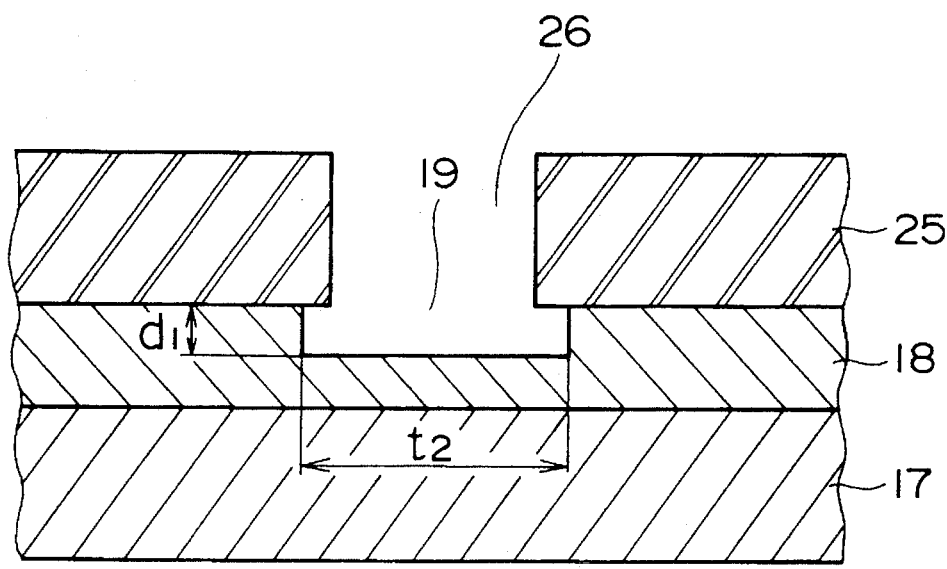
Figure 5C:
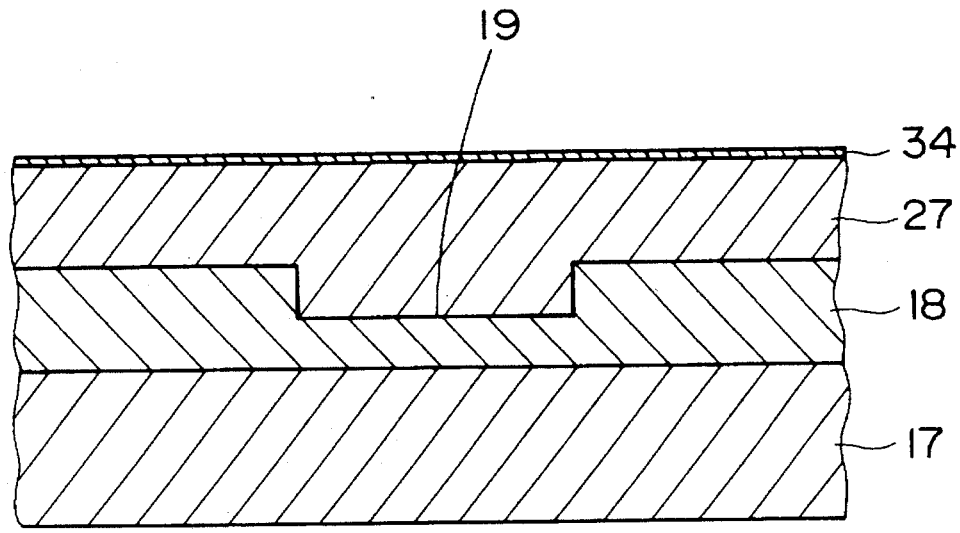

The semiconductor device shown in FIG. 4 may be fabricated by a process shown in FIGS. 5(a)–5(i), for example. The same reference numerals and symbols as used in FIG. 4 denote similar items or functions. The steps of forming semiconductor active layer 18 on semiconductor substrate 17, depositing a first resist layer 25 on semiconductor active layer 18, forming a first opening 26 in the first resist layer 25 shown in FIG. 5(a), forming recess 19 shown in FIG. 5(b), and forming amorphous material layer (hereinafter referred to as first amorphous material layer) 27 on semiconductor active layer 18 shown in FIG. 5(c), are substantially the same as those of the first embodiment, and, therefore, description of them is omitted.

Referring to FIG. 5(c), after depositing first amorphous material layer 27 having a thickness of about 0.3 μm at recess 19, a layer of crystalline metal, such as aluminum, 34 is deposited by a suitable method, such as vapor deposition or sputtering. The aluminum layer 34 has a thickness of about 0.05 μm or a value between 0.03 μm and 0.1 μm.

Figure 5D:
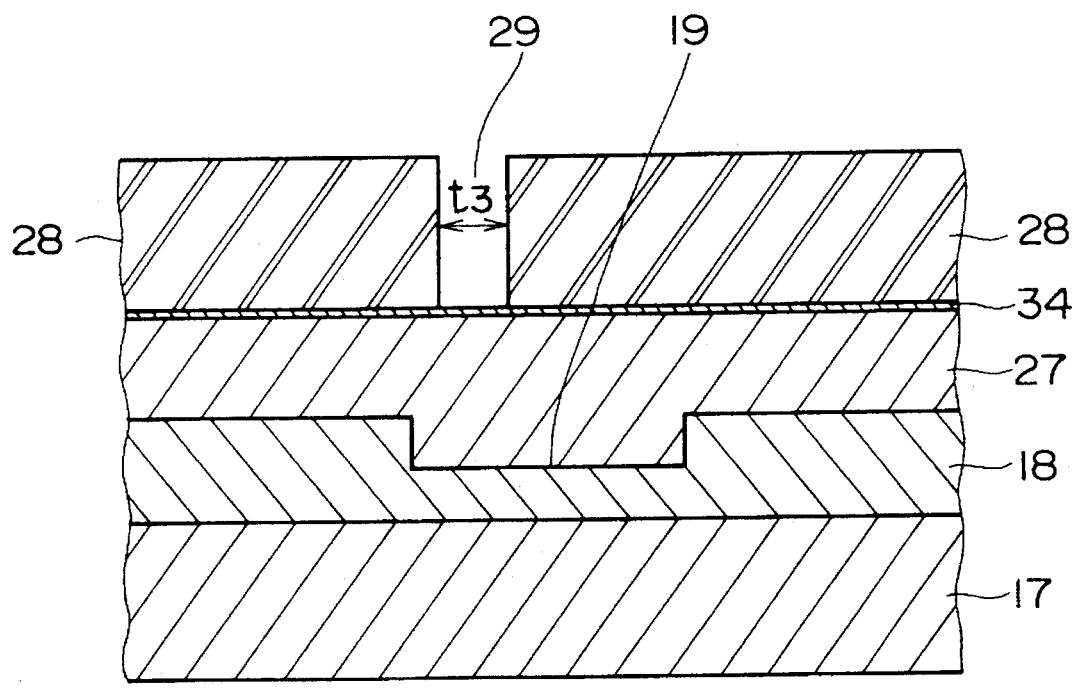

Thereafter, as shown in FIG. 5(d), second resist layer 28 is deposited to a thickness of about 0.8 μm or a value between 0.3 μm and 1.0 μm. A suitable photolithographic technique, such as electron beam direct-write lithography, is used to form second opening 29 in second resist layer 28 at a location corresponding to a location in recess 19 where leg 32 of gate electrode 31 is to be formed (i.e. a location adjacent to the source electrode side edge of recess 19), as shown in FIG. 5(d). The same material may be used for second resist layer 28. The width $t_3$ of second opening 29 is about 0.3 μm.

Figure 5E:
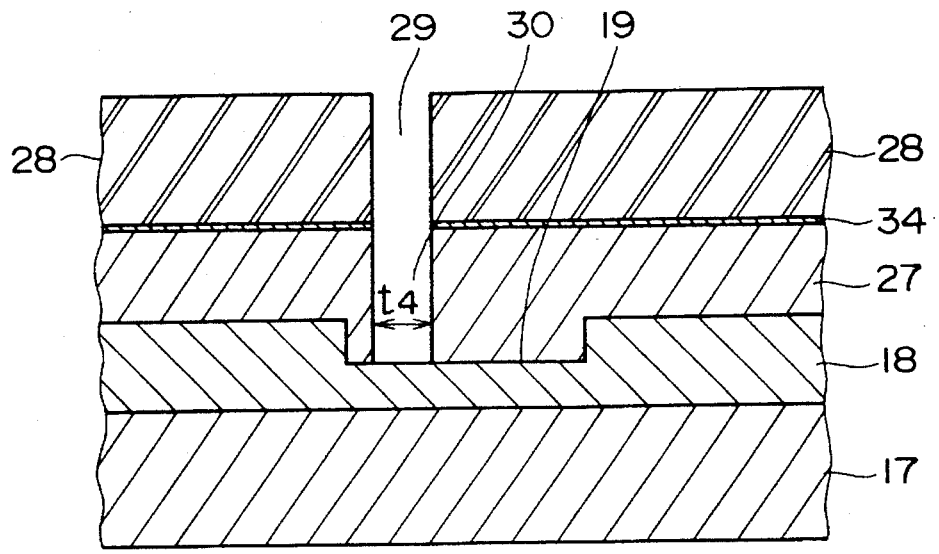

As shown in FIG. 5(e), second resist layer 28 is used as a mask to remove a portion of aluminum layer 34 exposed in second opening 29 by, for example, sputter etching. Thereafter, using resist layer 28 as a mask, first amorphous material layer 27 is subjected to etching, such as anisotropic dry etching. This produces a first through-hole 30 having a width $t_4$ of about 0.3 μm in first amorphous material layer 27, which communicates with second opening 29 and extends to recess 19. Anisotropic dry etching used here may be, for example, reactive ion etching (RIE) or reactive ion beam etching (RIBE).

Figure 5F:
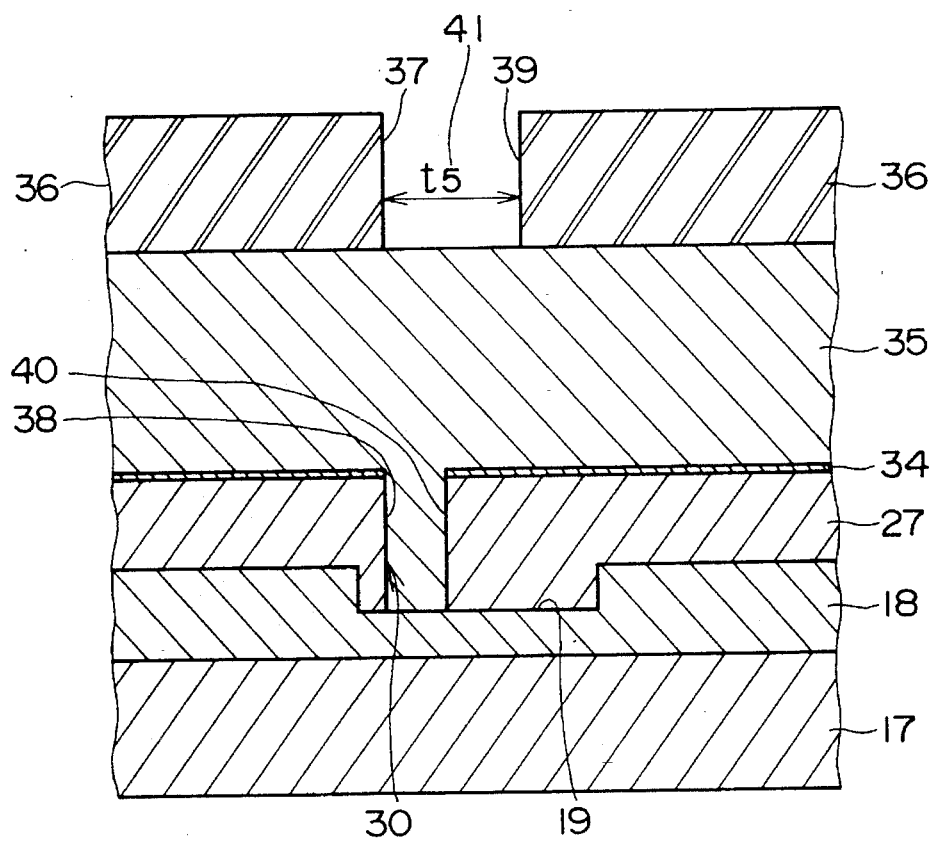
Figure 5:
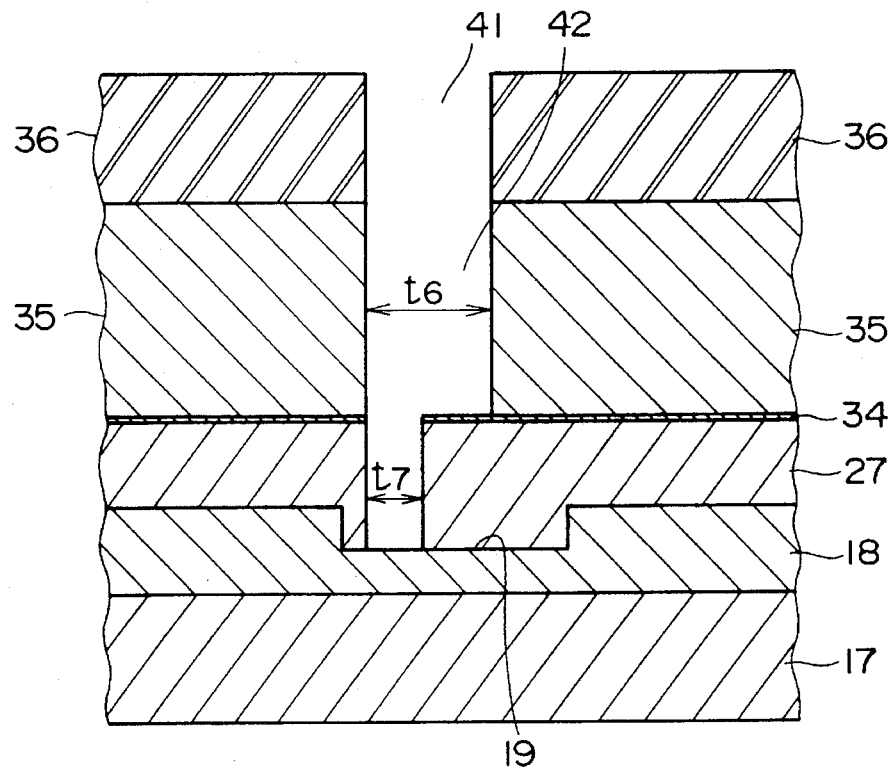
Figure 5:
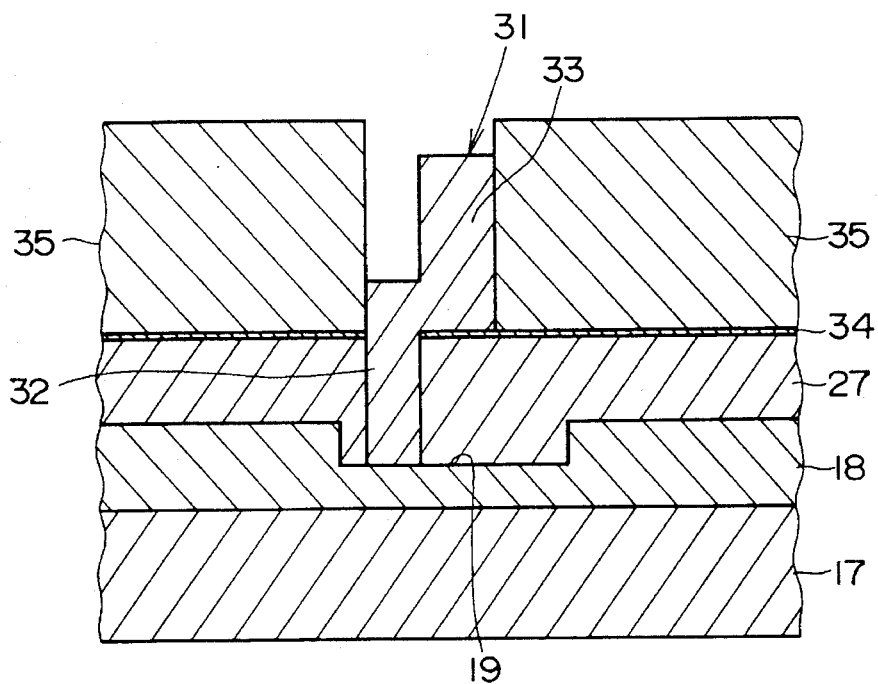

Second resist 28 is then removed by dissolving it in, for example, an organic solvent, such as acetone, and, thereafter, a second amorphous material layer 35 is disposed on semiconductor active layer 18 exposed through first by-hole 30 and on aluminum layer 34. Second amorphous material layer 35 has a planar top surface as shown in FIG. 5(f). Second amorphous material layer 35 may be, for example, a silicon nitride film, a SiO film, a SiON film or the like, and has a thickness of about 0.1 μm or a value between 0.5 μm and 1.5 μm.

A third resist layer 36 (FIG. 5(f)) is then deposited on second amorphous material layer 35 to a thickness of about 0.4 μm. A suitable photolithographic technique, such as electron beam direct-write lithography, is used to form a third opening 41 in third resist layer 36, such that the source electrode side edge 37 of opening 41 is substantially aligned with the source electrode side edge 38 of first through-hole 30 and the drain electrode side edge 39 is located closer to drain electrode 24 than the drain electrode side edge 40 of first through-hole 30. The width $t_5$ of third opening 41 is about 0.7 μm or a value between 0.3 μm and 1.0 μm.

Second amorphous material layer 35 is subjected to etching, such as, for example, anisotropic dry etching, using third resist layer 36 as a mask. This produces a second through-hole 42 which communicates with third opening 41 and extends to recess 19, as shown in FIG. 5(g). Second through-hole 42 has a width $t_6$ of about 0.6 μm above aluminum layer 34 and has a width $t_7$ of about 0.3 μm below aluminum layer 34 which is substantially equal to the width $t_4$ of first through-hole 30. For example, reactive ion etching (RIE) or reactive ion beam etching (RIBE) may be used to etch second amorphous material layer 35.

Thereafter, third resist 36 is removed by dissolving it in an organic solvent, such as acetone. After that, a gate electrode material, such as aluminum, is selectively deposited on semiconductor active layer 18 and aluminum layer 34 exposed through second through-hole 42 by, for example, MOCVD which utilizes thermal decomposition of dimethylaluminum hydride, as shown in FIG. 5(h). Aluminum selectively deposited on semiconductor active layer 18 in recess 19 provides leg 32 of gate electrode 31, and aluminum selectively deposited on aluminum layer 34 becomes head 33. Selective deposition of aluminum is continued until the top portion of leg 32 and the lower end portion of head 33 are joined, as shown in FIG. 5(h).

The thus completed gate electrode has a transverse cross-sectional area of leg 32 substantially constant over the entire height of leg 32. By selecting an appropriate thickness of amorphous layer 27, leg 32 having a desired height $H_d$ as measured from the surface of recess 19 to the lower surface of head 33 (see FIG. 4) is obtained. The height $H_d$ effectively corresponds to the height $H_b$ of the first embodiment shown in FIG. 2. Also, a desired height $H_c$ of head 33 can be obtained by appropriately determining the period of the selective aluminum deposition.

Then, second amorphous material layer 35 is removed by isotropic dry etching, such as plasma etching. After that, sputter etching, RIE etching or the like is used to remove aluminum layer 34. Then, first amorphous material layer 27 is removed by isotropic dry etching, such as plasma etching. After that, as shown in FIG. 5(i), source electrode 23 and drain electrode 24 are disposed on semiconductor active layer 18 on opposite sides of gate electrode 31. In FIG. 5(i), a phantom line on top of gate electrode 31 indicates a portion of head 33 which has been removed when aluminum layer 34 is removed by sputter etching.

As described above, according to the present invention, a gate electrode metal is selectively grown on aluminum layer 34 within second through-hole 42 by MOCVD, as shown in FIGS. 5(g) and 5(h), so that head 33 can be located on the drain electrode side of the top end of leg 32 of gate electrode 31, which is far from source electrode 23. Accordingly, the electrostatic capacitance between source electrode 23 and gate electrode 31 can be minimized.

The present invention is described to use MOCVD for selectively depositing a gate electrode metal, but any other known suitable technique may be used instead. Furthermore, other metals than aluminum can be used for the gate electrode. Also, a layer of any other suitable crystalline metal than aluminum may be used in place of aluminum layer 34 in the second embodiment.

What is claimed is:

1. A method of making a semiconductor device having a gate electrode, a drain electrode, and a source electrode comprising:

depositing a first amorphous material layer on a semiconductor active layer disposed on a semiconductor substrate;

depositing a crystalline metal layer on said first amorphous material layer;

forming a first resist layer on said crystalline metal layer, said first resist layer having a first opening for defining dimensions and location of a leg of a gate electrode to be formed;

using said first resist layer as a mask, removing a portion of said crystalline metal layer, and thereafter etching said first amorphous material layer to form a first through-hole communicating with the first opening in said first resist layer and extending through said first amorphous material layer and said crystalline metal layer;

removing said first resist layer;

depositing a second amorphous material layer covering said crystalline metal layer and filling the first through-hole;

forming a second resist layer on said second amorphous material layer, said second resist layer having a second opening therein, a source electrode side edge of the second opening being substantially in alignment with a source electrode side edge of the first through-hole, a drain electrode side edge of the second opening being closer to a drain electrode side than a drain electrode side edge of the first through-hole;

using said second resist layer as a mask, etching said second amorphous material layer to form a second through-hole communicating with the second opening in said second resist layer and extending through said second amorphous material layer;

removing said second resist layer;

selectively depositing a gate electrode metal on said semiconductor active layer and said crystalline metal layer exposed by the second through-hole to form the gate electrode;

removing said second amorphous material layer and, thereafter, removing said crystalline metal layer; and removing said first amorphous material layer.

2. The method of claim 1 including selectively depositing said gate electrode metal by metal organic chemical vapor deposition.

3. The method of claim 2 including depositing aluminum as said gate electrode metal using dimethylaluminum hydride as a source of said aluminum.

* * * * *